United States Patent
Okuno et al.

(10) Patent No.: US 10,287,646 B2
(45) Date of Patent: May 14, 2019

(54) POROUS METAL BODY AND METHOD FOR PRODUCING SAME

(71) Applicants: SUMITOMO ELECTRIC INDUSTRIES, LTD., Osaka-shi, Osaka (JP); SUMITOMO ELECTRIC TOYAMA CO., LTD., Imizu-shi, Toyama (JP)

(72) Inventors: Kazuki Okuno, Itami (JP); Masatoshi Majima, Itami (JP); Kengo Tsukamoto, Imizu (JP); Hitoshi Tsuchida, Imizu (JP); Hidetoshi Saito, Imizu (JP)

(73) Assignees: SUMITOMO ELECTRIC INDUSTRIES, LTD., Osaka-shi, Osaka (JP); SUMITOMO ELECTRIC TOYAMA CO., LTD., Imizu-shi, Toyama (JP)

(*) Notice: Subject to any disclaimer, the term of this patent is extended or adjusted under 35 U.S.C. 154(b) by 714 days.

(21) Appl. No.: 14/899,275

(22) PCT Filed: Apr. 9, 2014

(86) PCT No.: PCT/JP2014/060253
§ 371 (c)(1),
(2) Date: Dec. 17, 2015

(87) PCT Pub. No.: WO2014/203594
PCT Pub. Date: Dec. 24, 2014

(65) Prior Publication Data
US 2016/0130678 A1  May 12, 2016

(30) Foreign Application Priority Data
Jun. 19, 2013 (JP) .................. 2013-128785

(51) Int. Cl.
| | | |
|---|---|---|
| C21D 9/00 | (2006.01) |
| C25D 1/08 | (2006.01) |
| C25D 5/12 | (2006.01) |
| C25D 7/00 | (2006.01) |
| C22C 1/08 | (2006.01) |
| H01M 4/80 | (2006.01) |
| C25D 5/14 | (2006.01) |
| C25D 5/50 | (2006.01) |
| C25D 5/56 | (2006.01) |
| C25D 15/00 | (2006.01) |
| B22F 7/00 | (2006.01) |
| C22C 1/04 | (2006.01) |
| C22F 1/02 | (2006.01) |
| C22F 1/10 | (2006.01) |
| C22F 1/11 | (2006.01) |
| C22F 1/16 | (2006.01) |
| C23C 14/14 | (2006.01) |
| C23C 14/34 | (2006.01) |
| C23C 14/58 | (2006.01) |
| C25D 3/04 | (2006.01) |
| C23C 28/02 | (2006.01) |
| H01M 8/0232 | (2016.01) |
| C25D 3/06 | (2006.01) |
| C25D 3/12 | (2006.01) |
| C25D 3/30 | (2006.01) |

(52) U.S. Cl.
CPC ............ *C21D 9/0068* (2013.01); *B22F 7/002* (2013.01); *C22C 1/0433* (2013.01); *C22C 1/08* (2013.01); *C22F 1/02* (2013.01); *C22F 1/10* (2013.01); *C22F 1/11* (2013.01); *C22F 1/16* (2013.01); *C23C 14/14* (2013.01); *C23C 14/34* (2013.01); *C23C 14/5873* (2013.01); *C23C 28/021* (2013.01); *C23C 28/027* (2013.01); *C23C 28/028* (2013.01); *C25D 1/08* (2013.01); *C25D 3/04* (2013.01); *C25D 5/12* (2013.01); *C25D 5/14* (2013.01); *C25D 5/50* (2013.01); *C25D 5/505* (2013.01); *C25D 5/56* (2013.01); *C25D 7/00* (2013.01); *C25D 15/00* (2013.01); *H01M 4/80* (2013.01); *H01M 8/0232* (2013.01); *B22F 2207/01* (2013.01); *B22F 2999/00* (2013.01); *C25D 3/06* (2013.01); *C25D 3/12* (2013.01); *C25D 3/30* (2013.01); *Y02T 50/6765* (2018.05)

(58) Field of Classification Search
CPC ................................. C21D 9/0068; C25D 1/08
USPC .......................................... 148/427
See application file for complete search history.

(56) References Cited

U.S. PATENT DOCUMENTS

| | | | |
|---|---|---|---|
| 3,312,546 A | 4/1967 | Mayer et al. | |
| 4,272,290 A * | 6/1981 | Lesgourgues ......... | B22F 1/0003 415/173.4 |
| 5,543,183 A | 8/1996 | Streckert et al. | |
| 5,798,033 A | 8/1998 | Uemiya et al. | |

FOREIGN PATENT DOCUMENTS

| | | |
|---|---|---|
| CN | 1177846 A | 4/1998 |
| JP | 55-018579 A | 2/1980 |
| JP | H4-83713 A | 3/1992 |
| JP | H11-154517 A | 6/1999 |
| JP | 2005-280164 A | 10/2005 |
| JP | 4378202 B | 12/2009 |
| JP | 2012-132083 A | 7/2012 |
| JP | 2012-149282 A | 8/2012 |
| WO | WO-2013/099532 A1 | 7/2013 |
| WO | WO-2014/050536 A1 | 4/2014 |

* cited by examiner

*Primary Examiner* — Weiping Zhu
(74) *Attorney, Agent, or Firm* — Drinker Biddle & Reath LLP

(57) ABSTRACT

Provided is a porous metal body having superior corrosion resistance to conventional metal porous bodies composed of nickel-tin binary alloys and conventional metal porous bodies composed of nickel-chromium binary alloys. The porous metal body has a three-dimensional network skeleton and contains at least nickel, tin, and chromium. The concentration of chromium contained in the porous metal body is highest at the surface of the skeleton of the porous metal body and decreases toward the inner side of the skeleton. In one embodiment, the chromium concentration at the surface of the skeleton of the porous metal body is more preferably 3% by mass or more and 70% by mass or less.

12 Claims, No Drawings

POROUS METAL BODY AND METHOD FOR PRODUCING SAME

TECHNICAL FIELD

The present invention relates to a porous metal body that can be used in current collectors of various batteries, capacitors, fuel cells, etc.

BACKGROUND ART

A method for producing a porous metal body, including performing an electrical conduction treatment on a resin porous body, forming an electroplating layer composed of metal on the treated resin porous body, and, if needed, burning away the resin porous body is known. An example thereof is described in PTL 1.

A porous metal body composed of a nickel-tin alloy has been proposed as a porous metal body that has oxidation resistance, corrosion resistance, and high porosity and is suitable for use in current collectors of various batteries, capacitors, fuel cells, etc. An example thereof is described in PTL 2.

A porous metal body composed of a nickel-chromium alloy has been proposed as a porous metal body having high corrosion resistance. An example thereof is described in PTL 3.

CITATION LIST

Patent Literature

[PTL 1] Japanese Unexamined Patent Application Publication No. 11-154517
[PTL 2] Japanese Unexamined Patent Application Publication No. 2012-132083
[PTL 3] Japanese Unexamined Patent Application Publication No. 2012-149282

SUMMARY OF INVENTION

Technical Problem

However, in recent years, there has been increasing demand for batteries, capacitors, fuel cells, etc., with higher output and higher capacity (size reduction), and under such circumstances, metal porous bodies that constitute current collectors are required to achieve further improvements in their oxidation resistance and corrosion resistance.

An object of the present invention is to provide a porous metal body that has superior corrosion resistance to conventional metal porous bodies composed of nickel-tin binary alloys and metal porous bodies composed of nickel-chromium binary alloys.

Solution to Problem

The inventors of the present invention have found that the above-described object can be achieved by a porous metal body that has a three-dimensional network skeleton and contains at least nickel, tin, and chromium, in which the concentration of chromium contained in the porous metal body is highest at a surface of the skeleton of the porous metal body and decreases toward the inner side of the skeleton.

The structure described above permits intentional or unintentional inclusion of at least one element other than nickel, tin, and chromium in the porous metal body provided that the object described above can be achieved.

Advantageous Effects of Invention

According to the present invention, a porous metal body that has superior corrosion resistance to conventional metal porous bodies composed of nickel-tin binary alloys and conventional metal porous bodies composed of nickel-chromium binary alloys can be provided.

DESCRIPTION OF EMBODIMENTS

In the description below, aspects of the present invention are described.

(1) A porous metal body according to an aspect of the present invention has a three-dimensional network skeleton and contains at least nickel, tin, and chromium, in which the concentration of chromium contained in the porous metal body is highest at the surface of the skeleton of the porous metal body and decreases toward the inner side of the skeleton.

According to the aspect (1) described above, a porous metal body having superior corrosion resistance to conventional metal porous bodies composed of nickel-tin binary alloys and conventional metal porous bodies composed of nickel-chromium binary alloys can be provided.

In particular, according to the aspect (1) described above, it is possible to increase the chromium concentration at the surface of the skeleton of the porous metal body, the surface being the place having the largest influence on corrosion resistance of the porous metal body, by using less chromium (on a mass basis) compared to a porous metal body having a completely homogeneous chromium concentration.

Thus, compared to a porous metal body having a homogeneous chromium concentration from the surface to the inner side of the skeleton, the amount of chromium used in production and the cost for raw materials can be suppressed.

Moreover, a significantly high temperature (for example, 1200° C.) must be held for a long time in order to evenly diffuse chromium throughout the skeleton of the porous metal body, and thus the energy cost is high.

In contrast, the aspect (1) only requires a minimum required amount of chromium be diffused from the surface of the skeleton of the porous metal body, and thus it is possible to improve corrosion resistance of a porous metal body while saving the energy cost required to diffuse chromium.

In addition to the aspect (1) above, the following aspect (2) is preferably employed.

(2) The chromium concentration at the surface of the skeleton of the porous metal body is preferably 3% by mass or more and 70% by mass or less and more preferably 5% by mass or more and 50% by mass or less.

According to the aspect (2), high corrosion resistance and high mechanical strength can be obtained and, at the same time, electrical conductivity suitable for current collectors can be obtained.

When the chromium concentration at the surface of the skeleton of the porous metal body is less than 3% by mass, corrosion resistance is degraded.

When the chromium concentration at the surface of the skeleton of the porous metal body is more than 70% by mass, contact resistance is increased due to a large fraction of chromium oxides at the surface of the skeleton.

The inventors of the present invention have found that the porous metal body that achieves the object described above can be produced according to aspects (3) to (12) described below.

(3) A method for producing the porous metal body described in (1) or (2) above includes a conductive coating layer forming step of forming a conductive coating layer on a surface of a porous base composed of a resin material; a nickel layer forming step of forming a nickel layer on a surface of the conductive coating layer; a chromium-dispersed-tin layer forming step of forming a tin layer on a surface of the nickel layer, the tin layer containing dispersed chromium particles; and a heat treatment step of inducing interdiffusion of metal atoms between the nickel layer and the tin layer containing dispersed chromium particles under heating.

According to the aspect (3), a tin layer having a high chromium content can be formed on a surface of the porous skeleton.

Preferably, the aspect (4) below is employed in addition to the aspect (3) above.

(4) The chromium-dispersed-tin layer forming step includes a chromium-particle-dispersing step of supplying chromium particles to a tin plating bath and stirring the tin plating bath so as to disperse chromium particles in the tin plating bath; and a chromium-dispersed-tin plating step of immersing the nickel layer in the tin plating bath.

According to the aspect (4), chromium particles can be evenly dispersed in the surface of the skeleton of the porous body.

(5) A method for producing the porous metal body described in (1) or (2) above includes a conductive coating layer forming step of forming a conductive coating layer on a surface of a porous base composed of a resin material; a nickel layer forming step of forming a nickel layer on a surface of the conductive coating layer; a tin layer forming step of forming a tin layer on a surface of the nickel layer; a chromium layer forming step of forming a chromium layer on a surface of the tin layer; and a heat treatment step of inducing interdiffusion of metal atoms between the nickel layer, the tin layer, and the chromium layer.

According to the aspect (5), the chromium concentration at the surface of the skeleton of the porous body can be increased.

Preferably, the aspect (6) below is employed in addition to the aspect (5) above.

(6) In the chromium layer forming step, the chromium layer is formed on the surface of the tin layer by a gas phase method.

According to the aspect (6), a layer having a high chromium concentration can be formed on the surface of the skeleton of the porous body by using less chromium.

Preferably, the aspect (7) below is employed in addition to the aspect (5) above.

(7) In the chromium layer forming step, the chromium layer is formed on the surface of the tin layer by immersing the tin layer in a chromium plating bath.

According to the aspect (7), a layer having a high chromium concentration can be formed on the surface of the skeleton of the porous body by using less chromium.

Preferably, the aspect (8) below is employed in addition to the aspect (5) above.

(8) In the chromium layer forming step, the chromium layer is formed on the surface of the tin layer by applying a mixture of chromium particles and a binder to the surface of the tin layer.

According to the aspect (8), a layer having a high chromium concentration can be formed on the surface of the skeleton of the porous body.

(9) A method for producing the porous metal body described in (1) or (2) above includes a conductive coating layer forming step of forming a conductive coating layer on a surface of a porous base composed of a resin material; a nickel-tin alloy layer forming step of forming a nickel-tin alloy layer on a surface of the conductive coating layer; a chromium layer forming step of forming a chromium layer on a surface of the nickel-tin alloy layer; and a heat treatment step of inducing interdiffusion of metal atoms between the nickel-tin alloy layer and the chromium layer.

According to the aspect (9), since nickel and tin are alloyed in advance, the heat treatment time for diffusing these elements can be shortened.

Preferably, the aspect (10) below is employed in addition to the aspect (9) above.

(10) In the chromium layer forming step, the chromium layer is formed on the surface of the nickel-tin alloy layer by a gas phase method.

According to the aspect (10), a layer having a high chromium concentration can be formed on the surface of the skeleton of the porous body by using less chromium.

Preferably, the aspect (11) below is employed in addition to the aspect (9) above.

(11) In the chromium layer forming step, the chromium layer is formed on the surface of the nickel-tin alloy layer by immersing the nickel-tin alloy layer in a chromium plating bath.

According to the aspect (11), a layer having a high chromium concentration can be formed on the surface of the skeleton of the porous body by using a small amount of chromium.

Preferably, the aspect (12) below is employed in addition to the aspect (9) above.

(12) In the chromium layer forming step, the chromium layer is formed on the surface of the nickel-tin alloy layer by applying a mixture of chromium particles and a binder to the surface of the nickel-tin alloy layer.

According to the aspect (12), a layer having a high chromium concentration can be formed on the surface of the skeleton of the porous body.

A specific example of the "porous metal body having a three-dimensional network skeleton" is Celmet (registered trademark of Sumitomo Electric Industries, Ltd.).

The "porous base composed of a resin material" may be any known or commercially available porous material composed of a resin. Specific examples of the porous base composed of a resin material include any one or combination of a foam body composed of a resin material, a nonwoven cloth composed of a resin material, a felt composed of a resin material, and a three-dimensional network object composed of a resin material.

The resin material constituting the porous base may be of any type but is preferably a material that can be burned away. Specific examples of the foam body composed of a resin material include urethane foam, styrene foam, and melamine foam resin. Urethane foam and the like are preferable from the viewpoint of increasing the porosity of the porous base. When the porous base has a sheet shape, the porous base is preferably composed of a flexible (does not break when bent) material from the handling viewpoint.

The porosity of the porous base is not limited and is appropriately selected according to the usage. The porosity is typically 60% or more and 98% or less and more preferably 80% or more and 96% or less.

The thickness of the porous base is not limited and is appropriately selected according to the usage. The thickness is typically 150 μm or more and 5000 μm or less, more preferably 200 μm or more and 2000 μm or less, and yet more preferably 300 μm or more and 1200 μm or less.

The "conductive coating layer" refers to an electrically conductive layer formed on the surface of the porous base composed of a resin material.

Any methods capable of forming a conductive coating layer on the surface of the porous base can be employed in the "conductive coating layer forming step". Specific examples of the "conductive coating layer forming step" includes a method of applying a mixture of electrically conductive particles (for example, particles of metal materials such as stainless steel and particles of carbon such as crystalline graphite, amorphous carbon black, etc.) and a binder to the surface of the porous base and a method of forming a layer composed of an electrically conductive metal material on the surface of the porous base by electroless plating, sputtering, vapor-deposition, ion-plating, or the like.

Specific examples of the electroless plating using nickel include a method of immersing the porous base in a known electroless nickel plating bath such as an aqueous nickel sulfate solution containing sodium hypophosphite or the like. If needed, the porous base may be immersed in an activating solution (washing solution produced by Japan Kanigen Co., Ltd.) containing a small amount of palladium ions prior to immersing the porous base in the plating bath.

Specific examples of sputtering using nickel include a method that involves fixing the porous base onto a substrate holder and applying DC voltage between the substrate holder and a target (nickel) while introducing inert gas so as to cause ionized inert gas to collide with nickel and inducing flying nickel particles to deposit onto the surface of the porous base, etc.

The conductive coating layer is to be continuously (in a manner that allows conduction) formed on the surface of the porous base and the metal plating weight thereof (amount attached to the porous base) is not limited. For example, when nickel is used to form the conductive coating layer, the coating weight is typically 5 $g/m^2$ or more and 15 $g/m^2$ or less and more preferably 7 $g/m^2$ or more and 10 $g/m^2$ or less.

The "nickel layer" is a layer composed of nickel (elemental nickel). Intentional or unintentional incorporation of at least one element other than nickel is permissible as long as the object described above is achievable.

Specific examples of "chromium particles" include particles of elemental chromium and particles of chromium oxides.

The "the tin layer containing dispersed chromium particles" is a layer composed of tin (elemental tin) with chromium particles dispersed therein. Intentional or unintentional incorporation of at least one element other than tin in the portion formed of tin (elemental tin) is permissible as long as the object described above is achievable.

The "tin layer" is a layer composed of tin (elemental tin). Intentional or unintentional incorporation of at least one element other than tin is permissible as long as the object described above is achievable.

The "chromium layer" is a layer composed of chromium (elemental chromium) or chromium oxide. Intentional or unintentional incorporation of at least one element other than chromium is permissible as long as the object described above is achievable.

The "gas phase method" is a generic name of techniques for forming thin films by using gas. Specific examples of the gas phase method include sputtering, a vapor deposition method, ion plating, and pulsed laser deposition (PLD).

The "binder" is a material that fixes chromium particles onto the surface of the skeleton of the porous body. Specific examples of the binder include various known materials such as polyvinylidene fluoride, styrene butadiene rubber, carboxymethyl cellulose, polytetrafluoroethylene, polyethylene, polypropylene, and polyvinyl alcohol.

The porous base composed of a resin material can be removed by burning or dissolving in a chemical solution.

In the case where the porous base composed of a resin material is to be removed by burning and the difference between the temperature of burning the porous base composed of a resin material and the temperature at which the porous metal body is held during the heat treatment step is small, the heat treatment step may also serve as the step of removing the porous base composed of a resin material (the porous base composed of a resin material can be removed in the heat treatment step).

EXAMPLES (Example 1) Chromium-Particle-Dispersed Plating

Details of Example 1 are described below. Example 1 provides a nickel-tin-chromium porous alloy body and is an embodiment of the present invention.

(Electrical Conduction Treatment on Three-Dimensional Network Resin)

First, a polyurethane foam sheet (cell size: 0.45 mm) having a thickness of 1.5 mm was prepared as the three-dimensional network resin (one embodiment of the porous base composed of a resin material). Then 90 g of graphite having an average particle diameter of 0.5 μm was dispersed in 0.5 L of a 10 mass % acrylic acid ester-based resin aqueous solution to prepare a conductive coating solution at this ratio.

The polyurethane foam sheet was continuously immersed in the coating solution, squeezed by rollers, and dried to conduct an electrical conduction treatment and form a conductive coating layer on the surface of the three-dimensional network resin. The viscosity of the conductive coating solution was adjusted with a thickening agent. The coating solution was prepared in such a way as to yield the desired alloy composition and adjust the coating weight of the dried conductive coating solution to 69 $g/m^2$.

A coating film of the conductive coating solution containing carbon particles is formed on the surface of the three-dimensional network resin through this step.

(Metal Plating Step)

The three-dimensional network resin subjected to the electrical conduction treatment was electroplated to deposit 300 $g/m^2$ of nickel and then 75 $g/m^2$ of a tin-chromium particle mixture by using a tin plating solution containing dispersed chromium particles having a volume-average particle diameter of 5 μm so as to form electroplating layers (an embodiment of the nickel layer and the chromium-particle-containing tin layer). A nickel sulfamate plating solution was used as the plating solution for nickel and an organic acid bath was used as the plating solution for tin.

A nickel plating layer and a chromium-particle-containing tin plating layer are formed on the coating film of the carbon particle-containing conductive coating solution through this step.

(Heat Treatment Step)

The porous metal body obtained through the steps described above was first heat-treated in air at 800° C. for 15 minutes so as to burn away the three-dimensional network resin and the binder. Then a heat treatment was conducted in a hydrogen atmosphere at 1000° C. for 50 minutes so as to reduce the metals oxidized by the in-air heat treatment and conduct alloying through thermal diffusion.

The three-dimensional network resin is removed by pyrolysis through this step. The nickel plating layer, the tin plating layer, and the chromium particles contained in the tin plating layer are reduced by the carbon particles contained in the conductive coating layer. The nickel plating layer, the tin plating layer, and the chromium component contained in the tin plating layer are alloyed through thermal diffusion. Eventually, an porous alloy body (sample 1) having a thickness of 1.5 mm, a metal plating weight of 375 g/m$^2$, a nickel content of 80% by mass, a tin content of 15% by mass, and a chromium content of 5% by mass was obtained.

(Example 2) Nickel Plating/Tin Plating/Chromium Sputtering

In Example 2, the process up to and including the electrical conduction treatment was the same as that in Example 1 and the detailed description therefor is omitted.

The three-dimensional network resin subjected to the electrical conduction treatment was electroplated to deposit 300 g/m$^2$ of nickel and then 60 g/m$^2$ of tin in a tin plating solution so as to form electroplating layers (an embodiment of the nickel layer and the tin layer). A nickel sulfamate plating solution was used as the plating solution for nickel and a sulfuric acid bath was used as the plating solution for tin.

A nickel plating layer and a tin plating layer are formed on the coating film of the carbon-particle-containing conductive coating solution through this step.

Next, 3 g/m$^2$ of chromium was deposited onto the nickel-tin porous body by sputtering. Sputtering was conducted in a sputtering machine charged with an inert atmosphere gas and the gas pressure during film deposition was 0.5 Pa.

Since the heat treatment step of Example 2 is identical to the heat treatment step of Example 1, the detailed description therefor is omitted.

The three-dimensional network resin is removed by pyrolysis through the heat treatment step. The nickel plating layer, the tin plating layer, and the sputtered chromium layer are reduced by carbon particles contained in the conductive coating layer. The nickel plating layer, the tin plating layer, and the sputtered chromium layer are alloyed through thermal diffusion. Eventually, an porous alloy body (sample 2) having a thickness of 1.5 mm, a metal plating weight of 363 g/m$^2$, a nickel content of 82.7% by mass, a tin content of 16.5% by mass, and a chromium content of 0.8% by mass was obtained.

(Example 3) Nickel Plating/Tin Plating/Chromium Plating

In Example 3, the process up to and including tin plating was the same as that in Example 2 and the detailed description therefor is omitted. A porous metal body with 300 g/m$^2$ nickel and 60 g/m$^2$ tin was obtained through the process so far.

Chromium plating was conducted by using a commercially available trivalent chromium plating solution so that the chromium metal plating weight was 30 g/m$^2$.

The heat treatment step in Example 3 was identical to the heat treatment step in Example 1 and the detailed description therefor is omitted.

The three-dimensional network resin is removed by pyrolysis through the heat treatment step. The nickel plating layer, the tin plating layer, and the chromium plating layer are reduced by carbon particles contained in the conductive coating layer. The nickel plating layer, the tin plating layer, and the chromium plating layer are alloyed through thermal diffusion. Eventually, an porous alloy body (sample 3) having a thickness of 1.5 mm, a metal plating weight of 390 g/m$^2$, a nickel content of 76.9% by mass, a tin content of 15.4% by mass, and a chromium content of 7.7% by mass was obtained.

(Example 4) Nickel Plating/Tin Plating/Chromium Particle Coating

In Example 4, the process up to and including tin plating was the same as that in Example 2 and the detailed description therefor is omitted. A porous metal body with 300 g/m$^2$ nickel and 60 g/m$^2$ tin was obtained through the process so far.

Subsequently, 12 g of chromium particles having a volume-average particle diameter of 3 μm were dispersed in 0.5 L of a 10 mass % acrylic acid ester-based resin aqueous solution and a chromium particle coating solution was prepared at this ratio.

Then the porous metal body was continuously immersed in the coating solution, the excess coating solution was removed with an air brush, and the porous metal body was dried so as to form a chromium particle coating layer on the surface of the porous metal body. The viscosity of the coating solution was adjusted with a thickening agent. The coating solution was prepared so as to yield the desired alloy composition and adjust the coating weight of the dried conductive coating solution to 69 g/m$^2$.

The heat treatment step in Example 4 was identical to the heat treatment step in Example 1 and the detailed description therefor is omitted.

The three-dimensional network resin is removed by pyrolysis through this step. The nickel plating layer, the tin plating layer, and the chromium particle coating layer are reduced by carbon particles contained in the conductive coating layer. The nickel plating layer, the tin plating layer, and the chromium particle coating layer are alloyed through thermal diffusion. Eventually, an porous alloy body (sample 4) having a thickness of 1.5 mm, a metal plating weight of 373 g/m$^2$, a nickel content of 80.3% by mass, a tin content of 16.1% by mass, and a chromium content of 3.6% by mass was obtained.

(Example 5) Nickel-Tin Alloy Plating/Chromium Sputtering

In Example 5, the process up to and including the electrical conduction treatment was the same as that in Example 1 and the detailed description therefor is omitted.

A commercially available plating solution was used for the nickel-tin alloy plating, and a nickel-tin porous alloy body with a metal plating weight of 360 g/m$^2$ was obtained.

Chromium sputtering and a heat treatment were conducted as in Example 2. Eventually, an porous alloy body (sample 5) having a thickness of 1.5 mm, a metal plating weight of 363 g/m$^2$, a nickel content of 30.3% by mass, a tin content of 68.9% by mass, and a chromium content of 0.8% by mass was obtained.

(Example 6) Nickel-Tin Alloy Plating/Chromium Plating

A nickel-tin porous alloy body was obtained as in Example 5, and chromium plating and a heat treatment were conducted as in Example 3. Eventually, an porous alloy body (sample 6) having a thickness of 1.5 mm, a metal plating weight of 390 g/m², a nickel content of 28.2% by mass, a tin content of 64.1% by mass, and a chromium content of 7.7% by mass was obtained.

(Example 7) Nickel-Tin Alloy Plating/Chromium Particle Coating

A nickel-tin porous alloy body was obtained as in Example 5, and chromium particle coating and a heat treatment were conducted as in Example 4. Eventually, an porous alloy body (sample 7) having a thickness of 1.5 mm, a metal plating weight of 373 g/m², a nickel content of 29.5% by mass, a tin content of 66.9% by mass, and a chromium content of 3.6% by mass was obtained.

Comparative Example 1

In the description below, a nickel-tin porous alloy body of Comparative Example 1 is described in detail.
(Electrical Conduction Treatment on Three-Dimensional Network Resin)

A polyurethane foam sheet (cell size: 0.45 mm) having a thickness of 1.5 mm was prepared as the three-dimensional network resin. Then 90 g of graphite having a volume-average particle diameter of 0.5 μm was dispersed in 0.5 L of a 10 mass % acrylic acid ester-based resin aqueous solution to prepare a conductive coating solution at this ratio.

The polyurethane foam sheet was continuously immersed in the coating solution, squeezed by rollers, and dried to conduct an electrical conduction treatment and form a conductive coating layer on the surface of the three-dimensional network resin. The viscosity of the conductive coating solution was adjusted with a thickening agent. The coating solution was prepared so as to yield the desired alloy composition and adjust the coating weight of the dried conductive coating solution to 55 g/m².

A coating film of the carbon-particle-containing conductive coating solution is formed on the surface of the three-dimensional network resin through this step.
(Metal Plating Step)

The three-dimensional network resin subjected to the electrical conduction treatment was electroplated to deposit 300 g/m² of nickel and then 53 g/m² of tin so as to form electroplating layers. A nickel sulfamate plating solution was used as the plating solution for nickel and a sulfuric acid bath was used as the plating solution for tin.

A nickel plating layer and a tin plating layer are formed on the coating film of the carbon-particle-containing conductive coating solution through this step.
(Heat Treatment Step)

The porous metal body obtained in the above-described step was heat-treated in air at 800° C. for 15 minutes to burn away the three-dimensional network resin and the binder. Subsequently, a heat treatment at 1000° C. was conducted for 50 minutes in a hydrogen atmosphere to reduce the metals oxidized in the in-air heat treatment and conduct alloying through thermal diffusion.

The three-dimensional network resin is removed by pyrolysis through this step. The nickel plating layer and the tin plating layer are reduced by carbon particles contained in the conductive coating layer and alloyed through thermal diffusion. Eventually, an porous alloy body (sample 11) having a thickness of 1.5 mm, a metal plating weight of 353 g/m², a nickel content of 85% by mass, and a tin content of 15% by mass was obtained.

Comparative Example 2

In the description below, a nickel-chromium porous alloy body of Comparative Example 2 is described in detail.
(Electrical Conduction Treatment on Three-Dimensional Network Resin)

First, a polyurethane foam sheet (cell size: 0.45 mm) having a thickness of 1.5 mm was prepared as the three-dimensional network resin. Then 90 g of graphite having a volume-average particle diameter of 0.5 μm was dispersed in 0.5 L of a 10 mass % acrylic acid ester-based resin aqueous solution to prepare a conductive coating solution at this ratio.

The polyurethane foam sheet was continuously immersed in the coating solution, squeezed by rollers, and dried to conduct an electrical conduction treatment and form a conductive coating layer on the surface of the three-dimensional network resin. The viscosity of the conductive coating solution was adjusted with a thickening agent. The coating solution was prepared so as to yield the desired alloy composition and adjust the coating weight of the dried conductive coating solution to 55 g/m².

A coating film of the conductive coating solution containing carbon particles is formed on the surface of the three-dimensional network resin through this step.
(Metal Plating Step)

The three-dimensional network resin subjected to the electrical conduction treatment was electroplated to deposit 300 g/m² of nickel so as to form an electroplating layer. A nickel sulfamate plating solution was used as the plating solution for nickel.

A nickel plating layer is formed on the coating film of the carbon-particle-containing conductive coating solution through this step.
(Heat Treatment Step)

The porous metal body obtained in the above-described step was heat-treated in air at 800° C. for 15 minutes to burn away the three-dimensional network resin and the binder. Subsequently, a heat treatment at 1000° C. was conducted for 50 minutes in a hydrogen atmosphere to reduce the metals oxidized in the in-air heat treatment.

The three-dimensional network resin is removed by pyrolysis through this step. The nickel plating layer is reduced by carbon particles contained in the conductive coating layer.
(Chromium Diffusing Step)

The nickel porous body obtained in the above-described step was subjected to a chromizing treatment (powder-pack method) to diffuse chromium. The nickel porous body was charged with a penetrant (chromium: 90% by mass, NH₄Cl: 1% by mass, Al₂O₃: 9% by mass) obtained by mixing chromium particles, ammonium chloride, and alumina particles, and heated to 800° C. in a hydrogen gas atmosphere to obtain a nickel-chromium porous alloy body.

Eventually, an porous alloy body (sample 12) having a thickness of 1.5 mm, a metal plating weight of 460 g/m², a nickel content of 65% by mass, and a chromium content of 35% by mass was obtained by adjusting the heating time in the chromizing treatment.
(Measurement of Surface Chromium Concentration)

The front side and the back side of each of the sheet samples (samples 1 to 7, 11, and 12) obtained in Examples and Comparative Examples above were analyzed with X-ray fluorescence to determine the surface chromium concentration of the skeleton. The measurement results are shown in Table 1 below. A portable-type X-ray fluorescence analyzer (NITON XL3t-700 produced by Thermo Fisher Scientific) was used in the measurement. Measurement was conducted by bringing the measuring unit into contact with the surface of the porous metal body to be measured.

TABLE 1

| Sample | Compositional ratio calculated from metal content (mass %) | | | Surface chromium concentration (mass %) | |
|---|---|---|---|---|---|
| | Nickel | Tin | Chromium | Front side | Back side |
| Sample 1 | 80.0 | 15.0 | 5.0 | 34.1 | 33.1 |
| Sample 2 | 82.6 | 16.5 | 0.8 | 25.6 | 27.2 |
| Sample 3 | 76.9 | 15.4 | 7.7 | 37.5 | 36.4 |
| Sample 4 | 80.3 | 16.1 | 3.6 | 32.5 | 32.7 |
| Sample 5 | 30.3 | 68.9 | 0.8 | 24.3 | 23.2 |
| Sample 6 | 28.2 | 64.1 | 7.7 | 35.9 | 33.8 |
| Sample 7 | 29.5 | 67.0 | 3.6 | 30.4 | 31.5 |
| Sample 11 | 85.0 | 15.0 | — | — | — |
| Sample 12 | 65.0 | — | 35.0 | 34.7 | 36.2 |

Table 1 shows that the metal porous bodies of samples 1 to 7 have high surface chromium concentrations compared to the chromium compositional ratios calculated from the metal contents (average of the chromium compositional ratio when the sample is viewed as a whole).

Specifically, the surface chromium concentration of each of the metal porous bodies of samples 1 to 7 is about 4 to 30 times higher than the chromium compositional ratio calculated from the metal content.

Accordingly, the concentration of chromium contained in the metal porous bodies of samples 1 to 7 is highest at the surface of the skeleton of the porous metal body and decreases toward the inner side of the skeleton.

In contrast, in the porous metal body of sample 12, the surface chromium concentration is about the same as the chromium compositional ratio calculated from the metal content.

Accordingly, the concentration of chromium contained in the porous metal body of sample 12 at the surface of the skeleton is nearly the same as that of the inner side of the skeleton.

(Corrosion Resistance Test)

A test based on ASTM G5-94 was performed to evaluate corrosion resistance of the sheet samples (samples 1 to 7, 11, and 12) obtained in Examples and Comparative Examples described above. The aqueous acidic solution used for anodic polarization curve measurement was prepared by adjusting pH of a 1 mol/L aqueous sodium sulfate solution with sulfuric acid.

The test temperature was 60° C. During testing, a hydrogen saturation state was created by hydrogen bubbling. The potential range for voltammetry was 0 V to 1.0 V relative to the standard hydrogen electrode since this range was considered to be the range that might actually be applied in the fuel cell, and the sweeping rate was 5 mV/s.

Regarding the corrosion resistance test, evaluation can be made on the basis of the value of the anodic current in the potential range actually used in the fuel cell through performing anodic polarization measurement on the material. The anodic polarization curve measurement of metal materials is described in JIS G 0579 (JIS G 0579, "Method of anodic polarization curves measurement for stainless steels") and ASTM G5-94 (ASTM G5-94 (2004), Standard Reference Test Method for Making Potentiostatic and Potentiodynamic Anodic Polarization Measurements). In particular, ASTM G5-94 describes evaluation of fuel cells and is employed in corrosion resistance test for materials in the field of fuel cells; thus, evaluation was made based on this technique (Chih-Yeh Chung, et al., J. Power Sources, 176, pp. 276-281 (2008), Shuo-Jen Lee, et al., J. Power Sources, Volume 131, Issues 1-2, pp. 162-168 (2004), M. Rendon-Belmonte ("o" in Rendon is with an acute accent), et al., Int. J. Electrochem. Sci., 7, pp. 1079-1092 (2012)).

(Results of Corrosion Resistance Test)

The current values at ASTM test potentials of 0.2 V and 0.8 V were measured from the sheet samples (samples 1 to 7, 11, and 12) obtained in Examples and Comparative Examples described above. The test was performed five times. The observed current values at the first cycle and the fifth cycle are shown in Table 2.

TABLE 2

| Sample | Current value at first cycle of ASTM (mA) | | Current value at fifth cycle of ASTM (mA) | |
|---|---|---|---|---|
| Test potential | 0.2 V | 0.8 V | 0.2 V | 0.8 V |
| Sample 1 | 1.18 | 0.77 | 1.16 | 0.75 |
| Sample 2 | 1.25 | 0.89 | 1.27 | 0.87 |
| Sample 3 | 0.99 | 0.63 | 1.01 | 0.62 |
| Sample 4 | 1.2 | 0.79 | 1.17 | 0.78 |
| Sample 5 | 1.28 | 0.93 | 1.26 | 0.94 |
| Sample 6 | 1.11 | 0.72 | 1.12 | 0.74 |
| Sample 7 | 1.21 | 0.82 | 1.23 | 0.79 |
| Sample 11 | 1.65 | 2.53 | 2.28 | 2.61 |
| Sample 12 | 0.16 | 5.9 | 0.96 | 7.7 |

Table 2 shows that the current values of samples 1 to 7 are lower than the current value of the sample 11 at both test potentials, 0.2 V and 0.8 V.

This shows that samples 1 to 7 have higher corrosion resistance than sample 11.

Samples 1 and 2 are compared with sample 12. At a test potential of 0.2 V, the current values of samples 1 and 2 are larger than that of sample 12. However, at a test potential of 0.8 V, the current values of samples 1 and 2 are about ⅕ of that of sample 12.

This shows that samples 1 and 2 have higher high-voltage-side corrosion resistance than sample 12.

The current values of samples 1 to 7 after the corrosion resistance test was repeated (current values at the fifth cycle) do not change significantly whereas the current value of sample 11 shows an increase at 0.2 V and the current value of sample 12 shows an increase at both 0.2 V and 0.8 V.

This shows that samples 11 and 12 have corrosion resistance degraded after repeating the corrosion resistance test.

The results described above show that samples 1 to 7 have superior durability to samples 11 and 12.

The embodiments disclosed herein are merely exemplary in all aspects and should not be construed as limiting. The scope of the present invention is defined not by the description above but by the claims and is intended to include all modifications within the meaning and the scope of the claims and equivalents thereof.

The invention claimed is:

1. A porous metal body having a skeleton with a three-dimensional network structure and comprising at least nickel, tin, and chromium,
   wherein a concentration of chromium contained in the porous metal body is highest at a surface of the skeleton of the porous metal body and decreases toward an inner side of the skeleton, the concentration of chromium at the surface of the skeleton is 4 to 30 times higher than an average chromium concentration of the skeleton.

2. The porous metal body according to claim 1, wherein the concentration of chromium at the surface of the skeleton of the porous metal body is 3% by mass or more and 70% by mass or less.

3. A method for producing the porous metal body according to claim 1, the method comprising:
   a conductive coating layer forming step of forming a conductive coating layer on a surface of a porous base composed of a resin material;
   a nickel layer forming step of forming a nickel layer on a surface of the conductive coating layer;
   a chromium-dispersed tin layer forming step of forming a tin layer on a surface of the nickel layer, the tin layer containing dispersed chromium particles; and
   a heat treatment step of inducing interdiffusion of metal atoms between the nickel layer and the tin layer containing dispersed chromium particles.

4. The method for producing the porous metal body according to claim 3,
   wherein the chromium-dispersed tin layer forming step includes
   a chromium-particle-dispersing step of supplying chromium particles to a tin plating bath and stirring the tin plating bath to disperse the chromium particles in the tin plating bath; and
   a chromium-dispersed tin plating step of immersing the nickel layer in the tin plating bath.

5. A method for producing the porous metal body according to claim 1, the method comprising:
   a conductive coating layer forming step of forming a conductive coating layer on a surface of a porous base composed of a resin material;
   a nickel layer forming step of forming a nickel layer on a surface of the conductive coating layer;
   a tin layer forming step of forming a tin layer on a surface of the nickel layer;
   a chromium layer forming step of forming a chromium layer on a surface of the tin layer; and
   a heat treatment step of inducing interdiffusion of metal atoms between the nickel layer, the tin layer, and the chromium layer.

6. The method for producing the porous metal body according to claim 5, wherein, in the chromium layer forming step, the chromium layer is formed on the surface of the tin layer by a gas phase method.

7. The method for producing the porous metal body according to claim 5, wherein, in the chromium layer forming step, the chromium layer is formed on the surface of the tin layer by immersing the tin layer in a chromium plating bath.

8. The method for producing the porous metal body according to claim 5, wherein, in the chromium layer forming step, the chromium layer is formed on the surface of the tin layer by applying a mixture of chromium particles and a binder to the surface of the tin layer.

9. A method for producing the porous metal body according to claim 1, the method comprising:
   a conductive coating layer forming step of forming a conductive coating layer on a surface of a porous base composed of a resin material;
   a nickel-tin alloy layer forming step of forming a nickel-tin alloy layer on a surface of the conductive coating layer;
   a chromium layer forming step of forming a chromium layer on a surface of the nickel-tin alloy layer; and
   a heat treatment step of inducing interdiffusion of metal atoms between the nickel-tin alloy layer and the chromium layer.

10. The method for producing the porous metal body according to claim 9, wherein, in the chromium layer forming step, the chromium layer is formed on the surface of the nickel-tin alloy layer by a gas phase method.

11. The method for producing the porous metal body according to claim 9, wherein, in the chromium layer forming step, the chromium layer is formed on the surface of the nickel-tin alloy layer by immersing the nickel-tin alloy layer in a chromium plating bath.

12. The method for producing the porous metal body according to claim 9, wherein, in the chromium layer forming step, the chromium layer is formed on the surface of the nickel-tin alloy layer by applying a mixture of chromium particles and a binder to the surface of the nickel-tin alloy layer.

* * * * *